US008824210B2

(12) United States Patent
La Rosa

(10) Patent No.: US 8,824,210 B2
(45) Date of Patent: Sep. 2, 2014

(54) HOT ELECTRON INJECTION NANOCRYSTALS MOS TRANSISTOR

(75) Inventor: Francesco La Rosa, Rousset (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 198 days.

(21) Appl. No.: 13/439,140

(22) Filed: Apr. 4, 2012

(65) Prior Publication Data

US 2012/0250417 A1 Oct. 4, 2012

(30) Foreign Application Priority Data

Apr. 4, 2011 (FR) .................................... 11 52885
Apr. 4, 2011 (FR) .................................... 11 52886

(51) Int. Cl.
*G11C 16/10* (2006.01)

(52) U.S. Cl.
CPC .................................... *G11C 16/10* (2013.01)
USPC ............ 365/185.18; 365/185.26; 365/185.28; 365/185.27

(58) Field of Classification Search
CPC .......... G11C 16/10; G11C 16/30; G11C 16/12
USPC .............. 365/185.18, 185.26, 185.28, 185.27
See application file for complete search history.

(56) References Cited

U.S. PATENT DOCUMENTS

2007/0232041 A1 10/2007 Choi et al.
2007/0262373 A1 11/2007 Park et al.

*Primary Examiner* — Connie Yoha
(74) *Attorney, Agent, or Firm* — Seed IP Law Group PLLC

(57) ABSTRACT

The disclosure relates to a hot electron injection MOS transistor, comprising source and drain regions formed in a semiconductor substrate, a control gate, and a floating gate comprising electrically conductive nanoparticles. The control gate comprises a first portion arranged at a first distance from the substrate, a second portion arranged at a second distance less than the first distance from the substrate, and an intermediary portion linking the first and the second portions.

24 Claims, 4 Drawing Sheets

HOT ELECTRON INJECTION NANOCRYSTALS MOS TRANSISTOR

BACKGROUND

1. Technical Field

The present disclosure relates to a hot electron injection MOS transistor, comprising source and drain regions implanted in a semiconductor substrate, a control gate, and a floating gate arranged between the control gate and the substrate to accumulate electrical charges.

2. Description of the Related Art

Conventionally, FLASH memories comprise MOS (Metal Oxide Semiconductor) transistors of the type cited above. The programming of such transistors is done in the presence of a high drain-source current using an injection of electrical charges into the floating gate called "hot electron injection". Erasing of the transistors is done however in a static manner by tunnel effect (also known as the Fowler-Nordheim effect), by applying biasing voltages to the transistors to extract the charges trapped in the floating gate without causing current to flow between the drain and the source.

It is known that hot electron injection transistors have a low injection efficiency, and a high programming current. This property limits the number of transistors that may be simultaneously programmed in a memory, generally 8, 16, or 32 transistors. In low-power consumption semiconductor products, the number of transistors that can be simultaneously programmed is however dictated by current consumption limitations.

FIGS. 1, 2, and 3 are cross-sectional views of conventional hot electron injection MOS transistor structures T1, T2, T3.

Transistor T1 comprises a P-type substrate 1, N-type source (S) 2 and drain (D) 3 regions, a floating gate FG1, and a control gate CG1. Floating gate FG1 and control gate CG1 are generally in polysilicon (polycrystalline silicon). Control gate CG1 and source 2 and drain 3 regions are provided with electrical contacts schematically shown in FIG. 1. Floating gate FG1 is electrically isolated from substrate 1 and from control gate CG1 by a dielectric material 10.

The programming of transistor T1 is done by applying a positive voltage $V_D$ to drain region 3, a positive voltage $V_{CG}$ to control gate CG1, and a zero (ground or GND) voltage $V_S$ to source region 2, these voltages being chosen so as to set the transistor in a saturated operating mode. The gate voltage $V_{CG}$ causes a vertical electrical field EV to appear. Electrical field EV causes an inversion zone 5 to appear in the substrate 1, forming a conductive N-type channel through which the electrons may flow, and which has a pinch-off zone 6 near drain region 3. The drain-source potential difference causes a current IDS to appear between drain region 3 and source region 2, corresponding to a flow of electrons traveling in the opposite direction between source region 2 and drain region 3. At pinch-off zone 6, the electrons have a high kinetic energy. The majority are propelled into drain region 3 whereas a small amount have a sufficient kinetic energy to reach the potential barrier of dielectric material 10 and penetrate into floating gate FG1, where they are trapped. The region of substrate 1 extending between pinch-off zone 6 and drain region 3 is also called the injection zone 7.

The electrical charges trapped in floating gate FG1 modify the threshold voltage of the transistor. This threshold voltage may then be measured by a sense amplifier, the output of which supplies a logical value 0 or 1 depending on whether the transistor is in the programmed or non-programmed state (the non-programmed state known as the erased state).

As indicated above, such a transistor structure T1 has a low injection efficiency, typically on the order of $10^{-5}$ to $10^{-6}$. The injection efficiency is conventionally the ratio between current IDS during programming and the current injected in the floating gate (the quantity of trapped electrical charges being equal to the injected current multiplied by the injection time).

This low efficiency can be explained by a high attenuation of the vertical electrical field EV near injection zone 7. This field is high around source region 2 but decreases as drain region 3 is approached, as it is neutralized by drain voltage $V_D$, which also causes pinching of the channel.

Transistor structure T2 shown in FIG. 2 differs from that of FIG. 1 by the fact that it has a nanocrystal floating gate structure NCFG1. Floating gate NCFG1 is made from a dielectric material 11 in which electrically conductive nanoparticles 12, for example of silicon or germanium, are embedded. These conductive particles 12 can accumulate electrical charges that modify the threshold voltage of the transistor, and have the same function as a conventional floating gate. The programming of transistor T2 is done in a manner similar to that indicated above, and the injection efficiency is equally low.

It may therefore be desired to provide a hot electron injection MOS transistor structure that has a higher injection efficiency than those shown in FIGS. 1 and 2.

BRIEF SUMMARY

Embodiments of the disclosure relate to a hot electron injection MOS transistor, comprising source and drain regions formed in a semiconductor substrate, a control gate, and a floating gate comprising electrically conductive nanoparticles able to accumulate electrical charges arranged between the control gate and the substrate, wherein the control gate comprises a first portion arranged on the side of the source region at a first distance from the substrate, a second portion arranged on the side of the drain region at a second distance, less than the first distance, from the substrate, and an intermediary portion linking the first and the second portions.

According to one embodiment, the difference between the first distance and the second distance is on the order of several nanometers to several tens of nanometers.

According to one embodiment, the first distance is on the order of 15 to 20 nanometers and the second distance is on the order of 7 to 14 nanometers.

According to one embodiment, the floating gate does not comprise electrically conductive nanoparticles between the first portion of the control gate and the substrate.

According to one embodiment, the first and second portions of the control gate are substantially the same length.

According to one embodiment, the control gate has a total length on the order of 200 nanometers ±20%.

According to one embodiment, the drain and source regions are N-doped regions and the substrate is a P-type well.

According to one embodiment, the MOS transistor comprises at least a first dielectric layer extending between the substrate and the first portion of the control gate and not extending between the substrate and the second portion of the control gate, and at least a second dielectric layer extending between the substrate and the first and second portions of the control gate, the first layer causing the second layer to be uneven, the unevenness essentially corresponding to the difference between the first distance and the second distance.

Embodiments of the disclosure also relate to a method of programming a MOS transistor according to the disclosure. The method comprises generating a first vertical electrical field by means of the first portion of the control gate and causing a first conductive channel to appear in the substrate, generating a second vertical electrical field greater than the first vertical electrical field by means of the second portion of the control gate, causing a current to flow between the drain and source regions, and injecting hot electrons in the floating gate by means of the second electrical field.

According to one embodiment, the method comprises applying a positive electrical potential to the control gate to generate the first and second vertical electrical fields, and applying a second potential electrical difference between the drain region and the source region to cause a current to flow between these regions.

Embodiments of the disclosure also relate to an integrated circuit memory on a semiconductor chip, comprising memory cells each comprising a transistor according to the disclosure.

Embodiments of the disclosure also relate to an integrated circuit on a semiconductor chip, comprising a memory according to the disclosure.

Embodiments of the disclosure also relate to a portable device comprising an integrated circuit according to the disclosure.

BRIEF DESCRIPTION OF THE SEVERAL VIEWS OF THE DRAWINGS

Implementation examples of MOS transistors according to the disclosure will be described in the following by reference in a non-limiting manner to the appended drawings, among which.

DETAILED DESCRIPTION

Figure 3:
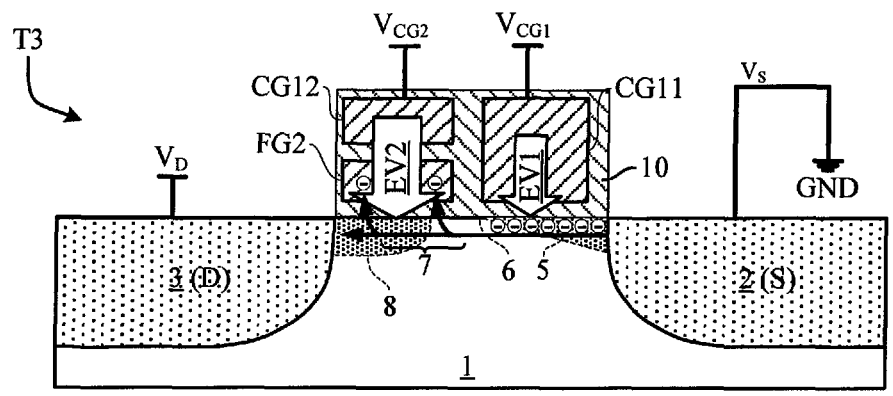
FIG. 3 is a cross-sectional view of a conventional hot electron injection MOS transistor structure.

FIG. 3 is a vertical cross-sectional view of a conventional hot electron injection transistor structure T3, aiming to improve the injection efficiency. Transistor T3 comprises two control gates CG11 and CG12, and one floating gate FG2. Control gate CG11 extends above substrate 1 on the side of source region 2 without floating gate FG2 therebetween. Floating gate FG2 is arranged between control gate CG12 and substrate 1, on the side of drain region 3. The electrical isolation of the different gates from each other and with respect to the substrate is ensured by dielectric material 10.

During the programming of the transistor, control gates CG11, CG12 receive distinct positive voltages $V_{CG1}$ and $V_{CG2}$ causing the appearances of a first vertical electrical field EV1 under control gate CG11 and of a second vertical electrical field EV2 under control gate CG12. More particularly, these voltages are chosen so as to cause the appearance of a first inversion zone 5 having a pinch-off zone 6 under control gate CG11, and a second inversion zone 8 under control gate CG12. The second inversion zone 8 has an substantially constant depth and no pinch-off zone. Transistor T3 is therefore the equivalent of two transistors in series, one operating in saturated mode and the other operating in linear mode. An injection zone 7 appears between pinch-off zone 6 and drain region 3.

By means of an appropriate choice of voltage VCG2, control gate CG12 allows the value of the vertical electrical field EV2 to increase in injection zone 7, increasing the injection efficiency. In exchange for this advantage, transistor T3 requires two distinct control gate voltages, which complicates the FLASH memory structure because two gate control lines must be provided instead of one for each wordline.

It therefore may be desired to provide a hot electron injection MOS transistor structure which has a good injection efficiency without requiring two control gates.

Figure 4:
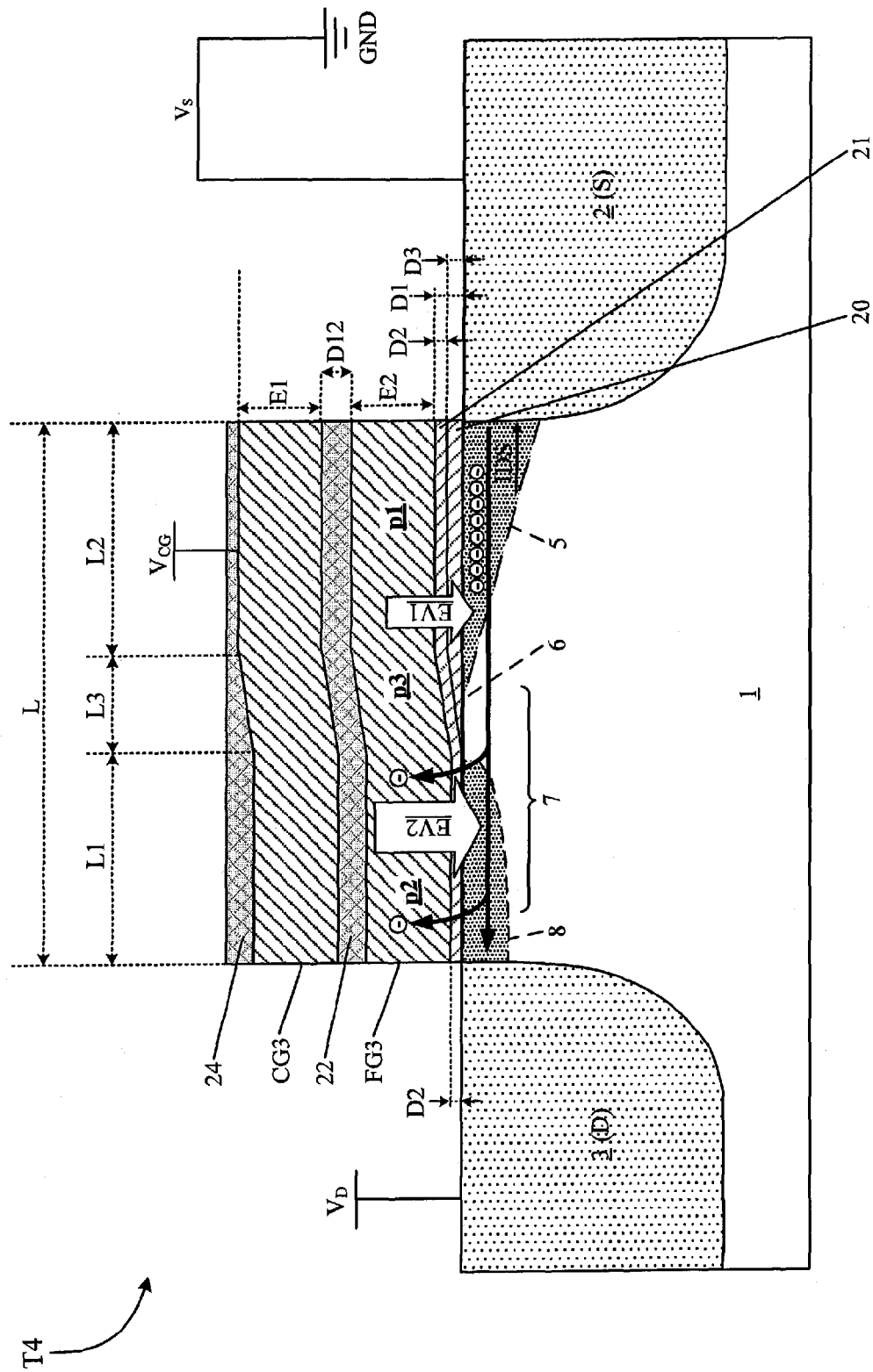
FIG. 4 is a cross-sectional view of an embodiment of a hot electron injection MOS transistor according to the disclosure.

FIG. 4 is a vertical cross-sectional view of a hot electron injection transistor T4 according to the disclosure. Transistor T4 conventionally comprises a P-type substrate 1, an N-type source (S) region 2, and an N-type drain (D) region 3. Substrate 1 is for example a P-well formed in an N-well, itself formed in a P-type silicon chip.

Transistor T4 comprises a control gate CG3 and a floating gate FG3, for example in polysilicon (polycrystalline silicon). Control gate CG3 has a thickness E1 and floating gate FG3 has a thickness E2. The two gates have substantially the same length L, and extend above the region of substrate 1 separating source region 2 and drain region 3. Control gate CG3, source region 2, and drain region 3 are provided with electrical contacts shown schematically in FIG. 4, allowing electrical voltages to be applied to them.

Floating gate FG3 comprises a first portion p1 extending parallel to substrate 1 at a distance D1 from it, a second portion p2 extending parallel to substrate 1 at a distance D2 from it, distance D2 being less than distance D1, and an intermediary portion p3 in an inclined form linking first portion p1 and second portion p2. Floating gate FG3 thus has portions p1 and p2 of unequal distances from the substrate, this unevenness respectively equal to the difference D1-D2 between distances D1 and D2.

Control gate CG3 is arranged above the floating gate, at a distance D12 therefrom. When the transistor is made by the deposition of layers of dielectric materials and of polysilicon which follow the form of the lower layers, the control gate may have a bent form similar to that of floating gate FG3.

In one embodiment, the unevenness D1-D2 of floating gate FG3 is obtained by means of a part 20 of a layer of dielectric material of a thickness D3, arranged under portion p1 of floating gate FG3 and forming a sort of "bulge" that is vertically translated to the entire structure of transistor T4.

More particularly, according to a method of fabricating transistor T4, a dielectric layer, for example of silicon dioxide (SiO2), of thickness D3 is formed on substrate 1 by means of an oxide growth method. The layer is then etched by the intermediary of an etch mask to form the part 20 of a layer that only covers half of the region of substrate 1 extending between source region 2 and drain region 3, on the side of source region 2. A second dielectric layer 21, of thickness D2, is formed on the substrate and on layer 20. Layer 21 may also be of silicon dioxide and be formed by growth. Layer 21 thus has an unevenness D1-D2, equal to thickness D3 of layer 20, between its portion covering layer 20 and its portion covering substrate 1. Floating gate FG3 is then formed on layer 21, and has the same unevenness as the layer. A layer of dielectric material 22 of thickness D12, for example an "inter-poly" oxide such as the "ONO" oxide (Oxide Nitride Oxide) is formed on the floating gate. Control gate CG3 is then formed on oxide layer 22. An oxide layer 24 is then deposited on the control gate, before deposition and etching of an interconnection metallic layer (not shown) forming a first metal layer called "Metal 1". The control gate contact, schematically shown as a vertical line, is in practice a metalized hole or "via" made in layer 24.

In an embodiment, transistor T4 has the following dimensions (in nanometers):
L1=L2=80 nm±20%
L3=40 nm±20%
E1=E2=400 nm±20%
D12=4 to 6 nm
D1=13 to 21 nm
D2=8 to 10 nm
D3=5 to 11 nm Moreover, in certain embodiments, lengths L1 and L2 of portions p1 and p2 may be different. Equally, length L3 of intermediary portion p3 depends on the fabrication method and can, in certain embodiments, only represent a small fraction of the total length L of each gate.

The programming of transistor T4 is done by applying a positive voltage $V_D$ to drain region 3, a positive voltage $V_{CG}$, preferably greater than $V_D$, to control gate CG3, and a zero (ground or GND) or less than 0 voltage $V_S$ to source region 2. A first vertical electrical field EV1 acts on substrate 1 under portion p1 of floating gate FG3 and a second vertical electrical field EV2, greater than first electrical field EV1, acts on substrate 1 under portion p2 of floating gate FG3. This amplitude variation of the vertical electrical field acting on substrate 1 is due to the fact that the vertical electrical field is inversely proportional to the distance between floating gate FG3 and substrate 1, and to the fact that the distance between portion p2 of floating gate FG3 and substrate 1 is less than the distance between portion p1 of floating gate FG3 and substrate 1.

A first inversion zone 5 forming a first conductive channel appears in substrate 1, under portion p1 of floating gate FG3. A second inversion zone 8 forming a second conductive channel appears under portion p2 of floating gate FG3. Inversion zone 5 has a pinch-off zone 6 situated essentially under intermediary portion p3 of floating gate FG3. An injection zone 7 appears between pinch-off zone 6 and drain region 3.

Under the effect of a horizontal electrical field created by the voltage difference $V_D$-$V_S$, a current IDS flows between drain region 3 and source region 2, corresponding to a flow of electrons traveling in the opposite direction between source region 2 and drain region 3. At pinch-off zone 6, the electrons have a high kinetic energy and are propelled into channel 8. A large number of these electrons reach drain region 3. Nevertheless, some of these electrons have a kinetic energy sufficient to cross the potential barrier of dielectric layer 21 and to penetrate into floating gate FG3, where they remain, trapped. The electrical charges trapped in floating gate FG3 modify the threshold voltage of the transistor. This threshold voltage may then be measured by a sense amplifier.

Figure 1:
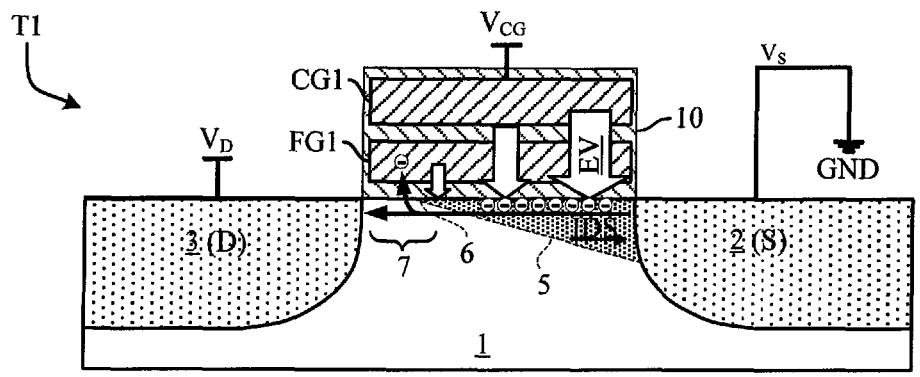
FIGS. 1, 2 previously described, are cross-sectional views of conventional hot electron injection MOS transistors.
Figure 2:
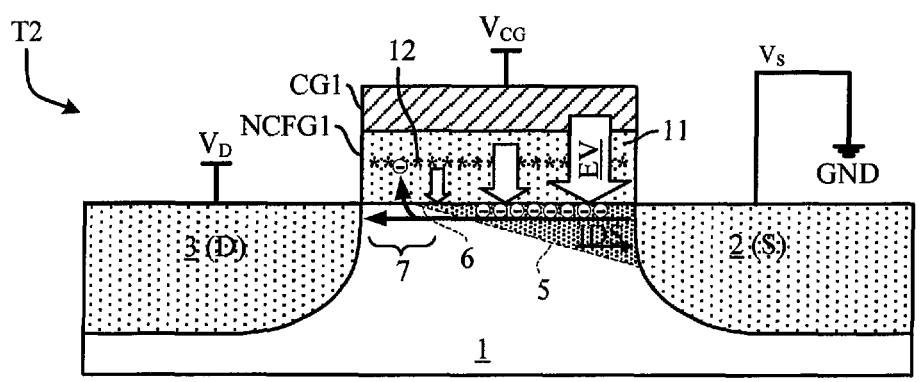

Thus, the increase of the vertical electrical field EV2 under portion p2 of floating gate FG3 increases the injection efficiency of the transistor all while causing second inversion zone 8 to appear. Transistor T4 has an injection efficiency greater than those of the conventional transistors shown in FIGS. 1 and 2, without requiring two gate control voltages.

Figure 5:
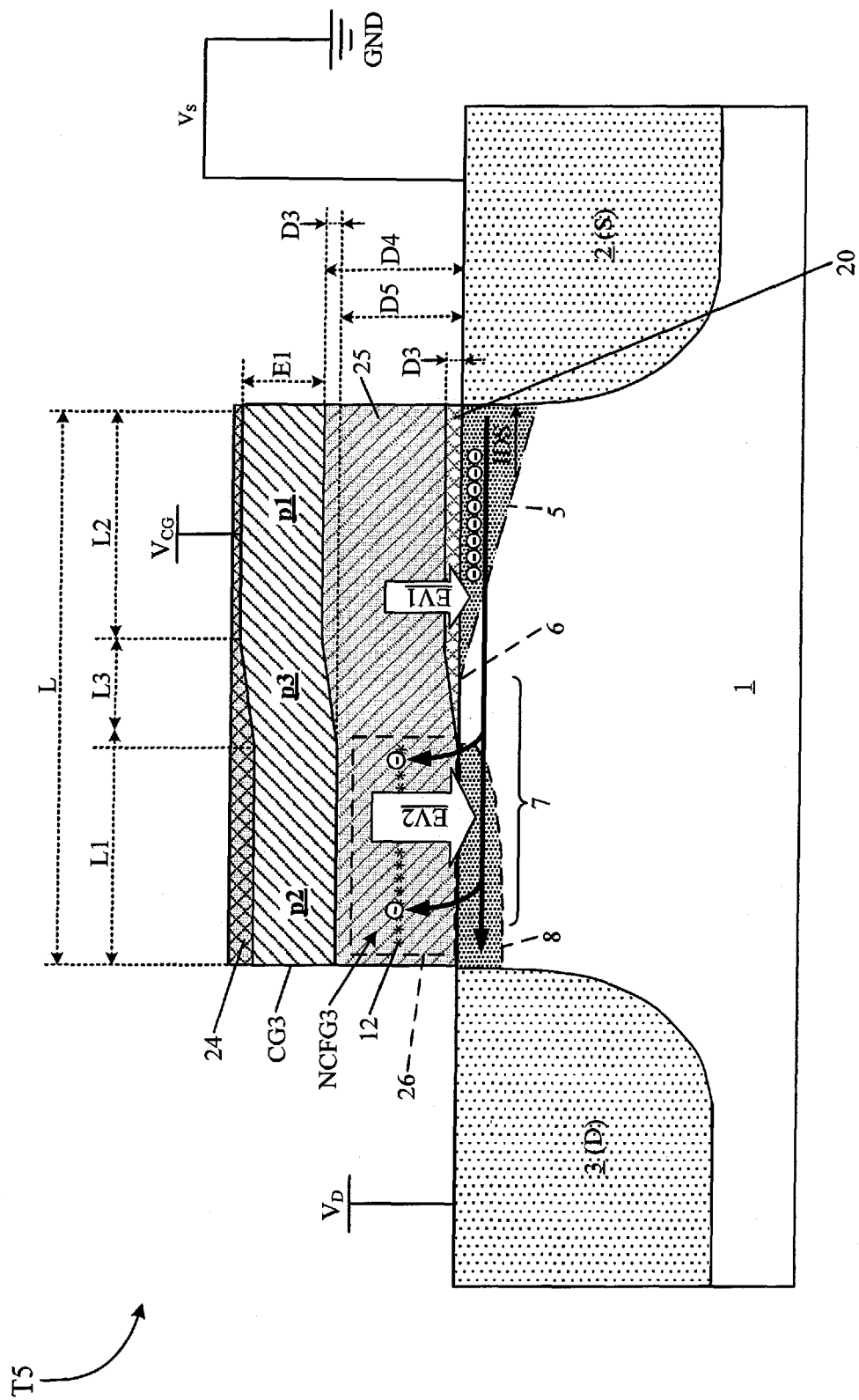
FIG. 5 is a cross-sectional view of another embodiment of a hot electron injection MOS transistor according to the disclosure.

FIG. 5 shows a second embodiment of a transistor T5 according to the disclosure. Transistor T5 comprises the same source 2 and drain 3 regions and the same control gate CG3 as transistor T4. Control gate CG3, of thickness E1, comprises a portion p1 situated at a distance D4 from substrate 1, a portion p2 situated at a distance D5 from substrate 1, distance D5 being less than distance D4, and a intermediary portion p3 extending between portions p1 and p2.

In one embodiment, distance D4 is on the order of 15 nm to 20 nm, and distance D5 is on the order of 7 nm to 14 nm.

The floating gate of transistor T4 previously described is replaced here by a nanocrystalline floating gate structure NCFG3, comprising electrically conductive nanoparticles 12, for example of silicon or germanium, embedded in a dielectric layer 25 that extends between substrate 1 and control gate CG3. These nanoparticles 12 can accumulate electrical charges that modify the threshold voltage of the transistor, and have the same function as floating gate FG3.

Preferably, the nanoparticles are embedded under portion p2 of control gate CG3, or else under portion p3, but are not embedded under portion p1.

In one embodiment, transistor T5 also comprises the portion of dielectric layer 20 of thickness D3, causing the unevenness D4-D5 to appear in control gate CG3. Layer 20, formed on substrate 1, extends under portion p1 of control gate CG3 and is here covered by dielectric layer 25, of thickness D5.

In one implementation variation, nanoparticles 12 are embedded in a dielectric material 26 extending under portion p2 of control gate CG3, whereas dielectric material 25 extends under portion p1 of control gate CG3, and the dielectric materials 25, 26 are different.

The programming of transistor T5 is done as previously by applying a positive voltage $V_D$ to drain region 3, a positive voltage $V_{CG}$ to control gate CG3, and a zero voltage (ground or GND) or less than 0 to source region 2. A first vertical electrical field EV1 acts on substrate 1 under portion p1 of control gate CG3 and a second vertical electrical field EV2, greater than the first electrical field EV1, acts on substrate 1 under portion p2 of the control gate. This amplitude variation of the vertical electrical field acting on substrate 1 is due here to the fact that the vertical electrical field is inversely proportional to the distance between control gate CG3 and substrate 1, and to the fact that distance D2 between portion p2 of control gate CG3 and substrate 1 is less than distance D1 between portion p1 of control gate CG3 and substrate 1.

First inversion zone 5 and pinch-off zone 6 may also be found in substrate 1, under portion p1 of control gate CG3, second inversion zone 8 under portion p2 of the control gate, and injection zone 7 between pinch-off zone 6 and drain region 3. In injection zone 7, certain electrons cross the potential barrier of dielectric layer 25 (or 26) to reach nanoparticles 12 of floating gate NCFG3, wherein they are trapped. Thus, as transistor T4, transistor T5 offers an injection efficiency higher than those of the conventional transistors shown in FIGS. 1, 2.

A transistor according to the disclosure is susceptible to various other implementation variations. In particular, it may be made according to various other known floating gate transistor fabrication methods. For example, in an implementation variation of transistor T4 or T5, floating gate FG3 or respectively control gate CG3 has a thickness that is not constant over its entire length. The unevenness D1-D2, D4-D5 is only respectively on the lower face across from substrate 1 of floating gate FG3 or control gate CG3. The upper face of floating gate FG3 or control gate CG3 is flat or else has any other form that may be desired.

A transistor according to the disclosure is equally susceptible to various applications, and in particular can allow the fabrication of various types of nonvolatile memory circuits, such as nonvolatile registers or FLASH memories.

Figure 6:
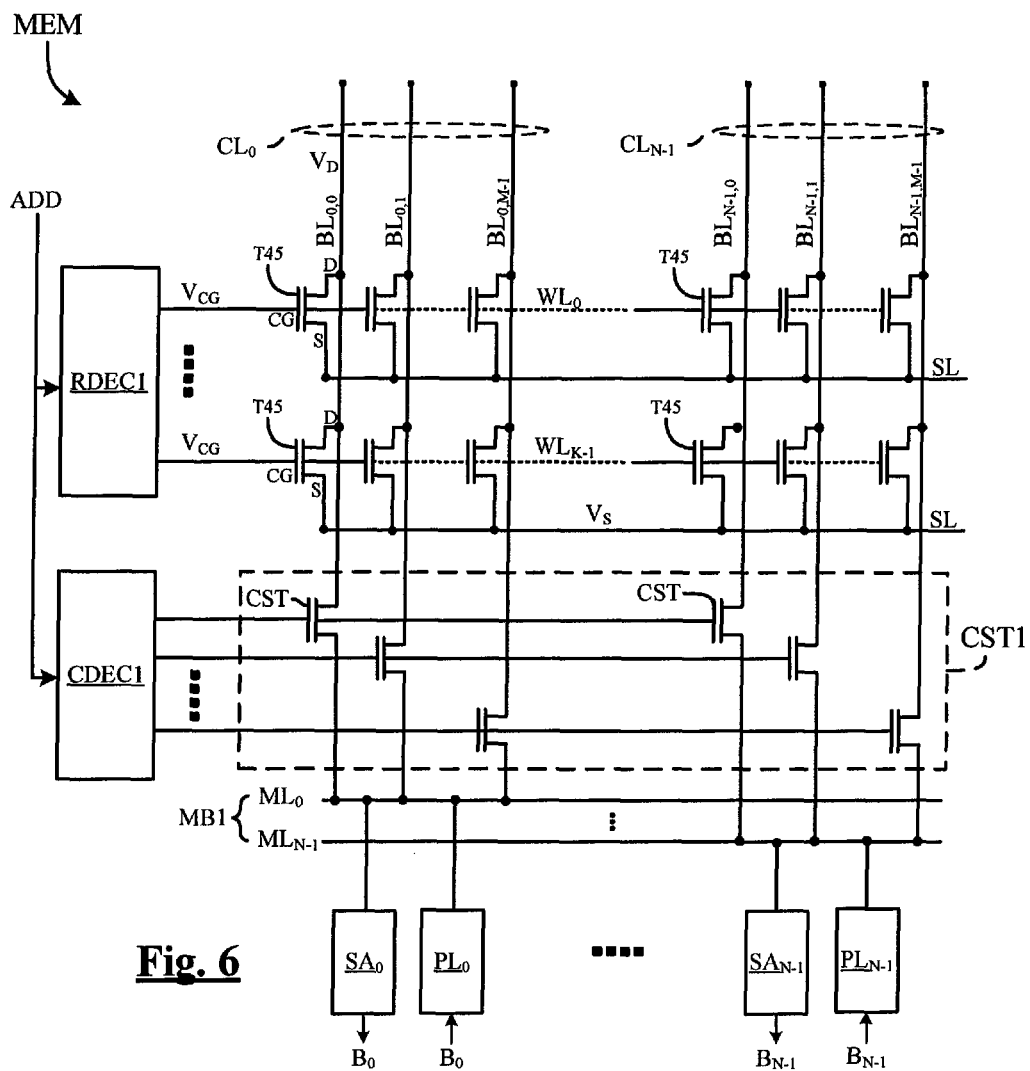
FIG. 6 shows an example of a FLASH memory comprising MOS transistors according to the disclosure.

FIG. 6 shows an implementation example of a FLASH-type memory MEM, in the form of an integrated circuit on a semiconductor chip. The memory comprises transistors T45 according to the disclosure, used as memory cells. Each transistor T45 is for example a transistor T4 or T5 as described above.

The memory is provided to receive K*M binary words of N bits each. It comprises K wordlines $W_k$ of rank "k" from 0 to K ($WL_{k=0}$ to $WL_{k=K}$), and N*M bitlines $BL_{n,m}$ of ranks "n" and "m" going respectively from 0 to N−1 and from 0 to M−1 ($BL_{0,0}$ to $BL_{0,M-1}$, ... $BL_{N-1,0}$ to $BL_{N-1,M-1}$). Bitlines $BL_{n,m}$ are grouped in columns $CL_n$ of rank "n" ($CL_0$, ... $CL_{N-1}$). Each column $CL_n$ comprises M bitlines $BL_{n,m}$.

Transistors T45 are arranged in lines and in columns. The control gates CG of transistors of a same line are connected to a same wordline $WL_k$ and the sources of these transistors are connected to a source line SL common to all the transistors of the memory. The drains of transistors of a same column of transistors are connected to the same bitline $BL_{n,m}$.

Memory MEM also comprises a row decoder RDEC1 receiving the least significant bits of a binary word address ADD, a column decoder CDEC1 receiving the most significant bits of address ADD, a column selection circuit CST1, a multiplexing bus MB1, N sense amplifiers $SA_0$ to $SA_{N-1}$, and N programming latches $PL_0$ to $PL_{N-1}$.

Row decoder RDEC1 applies a gate control voltage $V_{CG}$ to each wordline. The value of this voltage $V_{CG}$ depends on the state, selected or not selected, of the wordline, which is a function of address ADD applied to the decoder. Column selection circuit CST1 comprises N*M selection transistors CST controlled by column decoder CDEC1. Multiplexing bus MB1 comprises N multiplexing lines of rank "n" $ML_0$ to $ML_{N-1}$. Each column selection transistor CST links a bitline of rank "n" to a multiplexing line of the same rank. Each multiplexing line of rank "n" is linked to the input of a sense amplifier $SA_n$ of the same rank, and to the output of a programming latch $PL_n$ of the same rank.

When the memory is in read phase, the output of each sense amplifier $SA_n$ of rank "n" supplies the value of a bit $B_n$ ($B_0$ to $B_{N-1}$) of a word read in the memory. When the memory is in programming phase, each programming latch $PL_n$ of rank n receives the value of a bit $B_n$ of a word to write, and supplies a programming voltage $V_D$ when the value of the bit corresponds to a logical programming value (0 or 1 depending on the convention).

The table below presents example gate control $V_{CG}$, drain $V_D$, and source $V_S$ voltages applied to the transistors depending on their state, selected or non selected, and on the operation performed.

| Operation | State | Wordline Voltage $V_{CG}$ | Bitline Voltage $V_D$ | Source Line Voltage $V_S$ and P-well Voltage | N-well Voltage |
|---|---|---|---|---|---|
| Read | SEL | 5 V | 0.7 V | GND | $V_{DD}$ |
|  | NSEL | GND | Floating | GND | $V_{DD}$ |
| Program | SEL | Ramp from 3 to 9 V | 3.8 to 4.2 V | −1 V or GND | $V_{DD}$ |
|  | NSEL | GND | Floating | −1 V or GND | $V_{DD}$ |
| Erase | SEL | −10 V | Floating | Ramp from 3 to 9 V | Ramp from 3 to 9 V |

The voltage of the P-well is the voltage applied to substrate 1 when it is formed by a P-type well, and the N-well voltage is the voltage applied to an N-type well within which the P-well is fabricated. Labels "SEL" and "NSEL" designate the selected state and non selected state of a transistor. A transistor is selected when the line and the column in which it is found are both designated by address ADD. The term "floating" designates a floating potential (high impedance). "GND" designates the ground potential, and "$V_{DD}$" designates a supply voltage of the memory.

Figure 7:
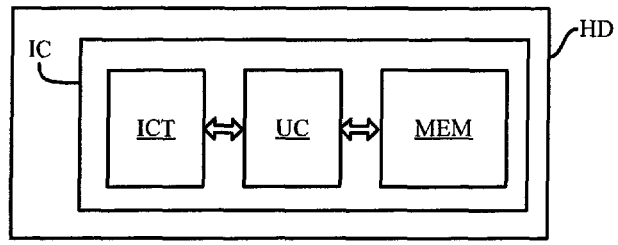
FIG. 7 shows a portable electronic device comprising an integrated circuit according to the disclosure.

FIG. 7 schematically shows a portable device HD comprising an integrated circuit IC according to the disclosure. The integrated circuit comprises a memory MEM according to the disclosure coupled to a central processing unit UC, which is coupled to a communication interface circuit ICT. Communication interface circuit ICT may be a contact interface, for example an ISO 7816 interface circuit, or a contactless interface, for example an ISO 14443 or ISO 15693 interface circuit operating by inductive coupling. Portable device HD is for example a chip card or an electronic tag. Device HD may be in general any type of device in which it is advantageous to use memory cells to inject hot electrons having a good injection efficiency and thus requiring a programming current less than conventional memory cells.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A hot electron injection MOS transistor, comprising:
   source and drain regions formed in a semiconductor substrate;
   a control gate; and
   a floating gate that includes electrically conductive nanoparticles configured to accumulate electrical charges, the floating gated being arranged between the control gate and the substrate, wherein the control gate comprises:
      a first portion arranged closer to the source region than to the drain region and at a first distance from the substrate;
      a second portion arranged closer to the drain region than to the source region, directly above a hot electron injection zone, and at a second distance, less than the first distance, from the substrate; and
      an intermediary portion linking the first and the second portions.

2. A MOS transistor according to claim 1, wherein between the first distance and the second distance differ on the order of several nanometers to several tens of nanometers.

3. A MOS transistor according to claim 1, wherein the first distance is on the order of 15 to 20 nanometers and the second distance is on the order of 7 to 14 nanometers.

4. A MOS transistor according to claim 1, wherein the floating gate does not comprise electrically conductive nanoparticles between the first portion of the control gate and the substrate.

5. A MOS transistor according to claim 1, wherein the first and second portions of the control gate are substantially the same length.

6. A MOS transistor according to claim 1, wherein the control gate has a total length on the order of 200 nanometers ±20%.

7. A MOS transistor according to claim 1, wherein the drain and source regions are N-doped regions and the substrate is a P-type well.

8. A MOS transistor according to claim 1, comprising:
a first dielectric layer extending between the substrate and a portion of the floating gate and not extending between the substrate and a second portion of the floating gate, and
a second dielectric layer extending between the substrate and the floating gate along an entire length of the floating gate,
the first dielectric layer causing the second dielectric layer to be uneven, the unevenness substantially corresponding to the difference between the first distance and the second distance.

9. A method of programming a MOS transistor according to claim 1, comprising:
generating a first vertical electrical field using the first portion of the control gate, and causing a first conductive channel to appear in the substrate,
generating a second vertical electrical field greater than the first vertical electrical field using the second portion of the control gate,
causing a current to flow between the drain and source regions, and
injecting hot electrons in the floating gate using the second vertical electrical field.

10. A method according to claim 9, wherein:
generating the first and second vertical electrical fields include applying a positive electrical potential to the control gate, and
causing the current to flow between the drain and source regions includes applying an electrical potential difference between the drain region and the source region.

11. An integrated circuit memory on a semiconductor chip, comprising:
memory cells each including a transistor having:
source and drain regions formed in a semiconductor substrate;
a control gate; and
a floating gate that includes electrically conductive nanoparticles configured to accumulate electrical charges, the floating gated being arranged between the control gate and the substrate, wherein the control gate comprises:
a first portion arranged closer to the source region than to the drain region and at a first distance from the substrate;
a second portion arranged closer to the drain region than to the source region, directly above a hot electron injection zone, and at a second distance, less than the first distance, from the substrate; and
an intermediary portion linking the first and the second portions.

12. An integrated circuit memory according to claim 11, wherein between the first distance and the second distance differ on the order of several nanometers to several tens of nanometers.

13. An integrated circuit memory according to claim 11, wherein the first distance is on the order of 15 to 20 nanometers and the second distance is on the order of 7 to 14 nanometers.

14. An integrated circuit memory according to claim 11, wherein the floating gate does not comprise electrically conductive nanoparticles between the first portion of the control gate and the substrate.

15. An integrated circuit memory according to claim 11, wherein the first and second portions of the control gate are substantially the same length.

16. An integrated circuit memory according to claim 11, wherein the control gate has a total length on the order of 200 nanometers ±20%.

17. An integrated circuit memory according to claim 11, wherein the drain and source regions are N-doped regions and the substrate is a P-type well.

18. An integrated circuit memory according to claim 11, wherein each transistor includes:
a first dielectric layer extending between the substrate and a portion of the floating gate and not extending between the substrate and a second portion of the floating gate, and
a second dielectric layer extending between the substrate and the floating gate along an entire length of the floating gate,
the first dielectric layer causing the second dielectric layer to be uneven, the unevenness substantially corresponding to the difference between the first distance and the second distance.

19. A portable device comprising:
an integrated circuit that includes:
memory cells each including a transistor having:
source and drain regions formed in a semiconductor substrate;
a control gate; and
a floating gate that includes electrically conductive nanoparticles configured to accumulate electrical charges, the floating gated being arranged between the control gate and the substrate, wherein the control gate comprises:
a first portion arranged adjacent to the source region and at a first distance from the substrate;
a second portion arranged adjacent to the drain region and at a second distance, less than the first distance, from the substrate; and
an intermediary portion linking the first and the second portions.

20. A portable device according to claim 19, wherein the integrated circuit includes a central processing unit coupled to the memory and configured to control the memory.

21. A portable device according to claim 19, wherein each transistor includes:
a first dielectric layer extending between the substrate and a first portion of the floating gate and not extending between the substrate and a second portion of the floating gate, and
a second dielectric layer extending between the substrate and an entire length of the floating gate,
the first dielectric layer causing the second dielectric layer to be uneven, the unevenness substantially corresponding to the difference between the first distance and the second distance.

22. A MOS transistor according to claim 1 wherein the floating gate includes a dielectric material, and the electrically conductive nanoparticles are embedded in the dielectric material.

23. An integrated circuit memory according to claim 11 wherein the floating gate includes a dielectric material, and the electrically conductive nanoparticles are embedded in the dielectric material.

24. A portable device according to claim 19 wherein the floating gate includes a dielectric material, and the electrically conductive nanoparticles are embedded in the dielectric material.

* * * * *